United States Patent [19]

Kevorkian et al.

[11] Patent Number: 5,148,064
[45] Date of Patent: Sep. 15, 1992

[54] MEDIUM VOLTAGE STATIC SWITCH

[75] Inventors: Antoine Kevorkian, Grenoble; Claude Raulet, Ecully; Gérard Rojat, Chaponost, all of France

[73] Assignee: Merlin Gerin, Meylan, France

[21] Appl. No.: 664,304

[22] Filed: Mar. 4, 1991

[30] Foreign Application Priority Data

Mar. 16, 1990 [FR] France ................ 90 03508

[51] Int. Cl.$^5$ .................................... H03K 17/60
[52] U.S. Cl. .................... 307/571; 307/574; 307/575; 307/577; 307/580; 307/584; 307/254
[58] Field of Search ........... 307/571, 580, 584, 577, 307/566, 270, 254, 574, 575

[56] References Cited

U.S. PATENT DOCUMENTS 4,751,408 6/1988 Rambert .................... 307/571
5,027,018 6/1991 Kindlmann et al. ......... 307/571

FOREIGN PATENT DOCUMENTS 0215707 3/1987 European Pat. Off. .
3100795 8/1982 Fed. Rep. of Germany .
3335475 5/1985 Fed. Rep. of Germany .

OTHER PUBLICATIONS

Review of Scientific Instruments, vol. 60, No. 8, Aug. 1989, pp. 2614–2627, "Picosecond Time–Resolved Circular Dichroism Spectroscopy: Experimental Details and Applications".

Primary Examiner—Eugene R. LaRoche
Assistant Examiner—Michael B. Shingleton
Attorney, Agent, or Firm—Parkhurst, Wendel & Rossi

[57] ABSTRACT

The medium voltage static switch is formed by serial connection of power semi-conductors, preferably of MOS type, controlled by a capacitive line. A diode is connected in parallel with the capacitor of the capacitive line between the gates of two adjacent semi-conductors. The control voltage is applied to a single control input, between the gate and source of the first stage semi-conductor.

9 Claims, 9 Drawing Sheets

MEDIUM VOLTAGE STATIC SWITCH

BACKGROUND OF THE INVENTION

The invention relates to a medium voltage static switch comprising a plurality of voltage-controllable power semi-conductors, each comprising a gate, a source and a drain, connected in series with a load impedance to the terminals of a voltage supply, and a control device forming with said semi-conductors a plurality of stages each comprising one of the semi-conductors.

State-of-the-art devices formed by serial connection of MOS power transistors are controled by means of pulse transformers. This type of control is not suitable for static control, i.e. at very low frequency.

SUMMARY OF THE INVENTION

The object of the invention is to achieve a medium voltage static switch which can operate both in static and medium frequency (up to 1 MHz approximately) and having a single control and a single power supply.

According to the invention this object is achieved by the fact that the control device comprises a single control input formed by first and second control terminals respectively connected to the source and gate of the semi-conductor of a first stage, of rank one, a capacitor and a diode being connected in parallel between the gates of two adjacent power semi-conductors, said diodes being reverse polarized when the switch is open.

A switch of this kind, with a capacitive control line formed by said capacitors and the internal gate-drain capacitor of the semi-conductor of the last stage, enables relatively high voltages to be switched very quickly, the switching speed being very close to that of an individual transistor. The number of semi-conductors, preferably of the MOS type, connected in series depends on the supply voltage and on the maximum permissible drain-source voltage Vds. To give an example, two semi-conductors will be used for a supply voltage of 380 V, three for a voltage of 1500 V, and five for a voltage of 2000 to 2500 V if the maximum voltage Vds is 500 V.

According to an improvement of the invention, each stage of rank higher than one comprises a detection circuit to whose input a voltage is applied representative of the drain-source voltage of the power semi-conductor of the stage of adjacent lower rank, the output of the detection circuit being connected to the gate of a first semi-conductor connected between the source and gate of the power semi-conductor of said stage of rank higher than one, so as to turn the latter power semi-conductor off when said drain-source voltage exceeds a preset threshold.

A detection circuit of this kind preferably comprises first and second resistances connected in series between the gates of the power semi-conductors of said stage of rank higher than one and of the stage of adjacent lower rank, a capacitor being connected in parallel to the first resistance and a Zener diode in parallel to the second resistance, the voltage at the terminals of the second resistance constituting the output voltage of the detector.

When the number of stages increases, the load current is limited by the control voltage. According to an improvement of the invention, to enable a current to be switched, of the same order of magnitude as the rated current acceptable by the power semi-conductors, each stage comprises a voltage regulator designed to limit the gate-source voltage applied to the power semi-conductor of said stage.

A voltage regulator of this kind preferably comprises a first input terminal, connected to the cathode of the diode associated with the stage for the stages of rank higher than one, and to the second control terminal for the stage of rank one, a second, input-output, terminal connected to the drain of the power semi-conductor of the stage involved, and a third, output, terminal connected to the gate of the power semi-conductor of the stage involved.

In order to equalize the drain-source voltages of the power semi-conductors of the different stages, a resistance is preferably connected in parallel to the capacitor and the diode connecting the gates of two adjacent power semi-conductors, and an additional resistance is connected between the gate and drain of the power semi-conductor of highest rank.

BRIEF DESCRIPTION OF THE DRAWINGS

Other advantages and features will become more clearly apparent from the following description of illustrative embodiments of the invention, given as non-restrictive examples only and represented in the accompanying drawings, in which:

FIGS. 10A to 10L represent the wave forms of various signals of a switch according to FIG. 9 on closing, figures 11A to 11L illustrate the wave forms of the same signals on opening of the switch.

DESCRIPTION OF THE PREFERRED EMBODIMENT

Figures 1, 2:
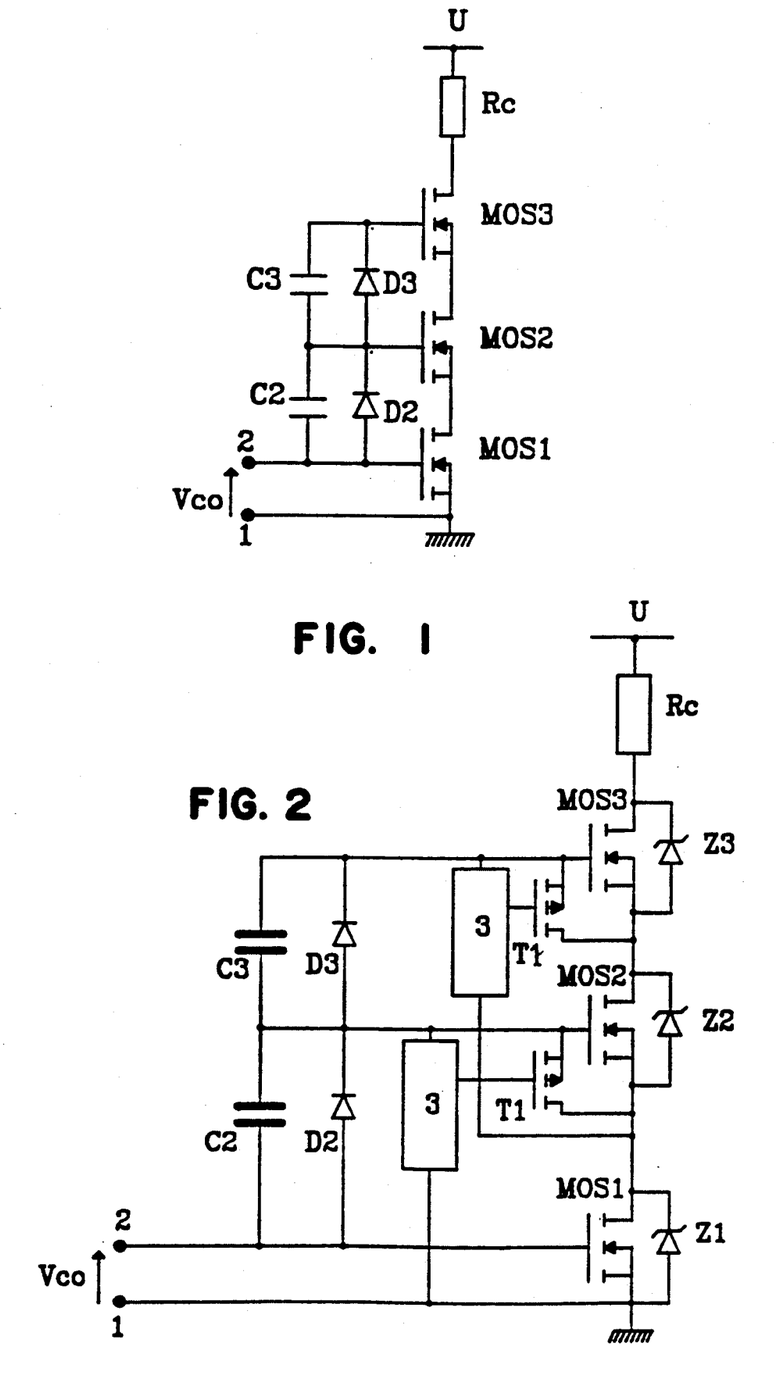
FIG. 1 illustrates a switch according to the invention.
FIG. 2 represents an alternative embodiment of the switch according to the invention.

In FIG. 1, the switch comprises three MOSFET-type power transistors MOS1, MOS2 and MOS3, connected in series with a load resistance Rc between the ground and a supply voltage U. A capacitor C2 is connected between the gates of transistors MOS1 and MOS2 of the first and second stages, and a capacitor C3 between the gates of transistors MOS2 and MOS3 of the second and third stages. A diode D2 is connected in parallel to the capacitor C2 and a diode D3 in parallel to the capacitor C3. In the figure, the transistors are N-type MOS, the supply voltage U is positive in relation to the ground and the anode of diode D2 is connected to the gate of transistor MOS1, the anode of diode D3 being connected to the gate of transistor MOS2. Switch control terminals 1 and 2 are respectively connected to the source and gate of transistor MOS1.

When the switch is open, and transistors MOS1, MOS2 and MOS3 off, applying a positive control voltage Vco between the control terminals turns the transistors on and consequently closes the switch. The control pulse is transmitted to the transistor gates by the capacitive control line, formed by capacitors C2 and C3 and by the internal gate-drain capacitor of transistor MOS3, and applying a gate-source voltage Vgs greater than its threshold voltage S turns the transistor concerned on. When transistor MOS1 is on, capacitor C2 discharges via the internal gate-source capacitor of transistor MOS2 and the drain-source junction of transistor MOS1. The same is true of the upper stages, capacitor C3 discharging via the internal gate-source capacitor of MOS3 and the drain-source junctions of MOS2 and MOS1. The source potential of each of the transistors is appreciably that of the ground due to the fact that the lower stages are on.

The gate-source capacitors of the upper stage transistors are then kept charged, at a gate-source voltage Vgs sufficient to guarantee that the transistors are on, by a current flowing through diode D2 for MOS2, and diodes D2 and D3 for MOS3. Indeed, after the transient closing period of the switch, the gate-source voltages of transistors MOS2 and MOS3 are respectively fixed by:

$$Vgs2 = Vco - Vd2 - Vds1 \quad (1)$$

$$Vgs3 = Vco - Vd2 - Vd3 - Vds1 - Vds2 \quad (2)$$

Vds1 and Vds2 being respectively the drain-source voltages of transistors MOS1 and MOS2, and Vd2 and Vd3 the voltages at the terminals of diodes D2 and D3.

To turn the transistors off and open the switch, the control voltage Vco is reduced to zero. Transistor MOS1, whose gate-source voltage is reduced to zero, is turned off. The gate-source voltages of transistors MOS2 and MOS3 are then given by:

$$Vgs2 = Vc2 - Vds1 \quad (3)$$

$$Vgs3 = Vc2 + Vc3 - Vds1 - Vds2 \quad (4)$$

Vc2 and Vc3 being respectively the voltages at the terminals of capacitors C2 and C3.

When turn-off takes place, capacitors C2 and C3, which were short-circuited respectively by diodes D2 and D3, are charged at voltages Vc2 and Vc3 close to −0.7 V, whereas the internal drain-source capacitors of transistors MOS1 and MOS2 are charged at voltages Vds1 and Vds2 which are typically close to 5 V. A negative gate-source voltage (−5.7 V) is therefore applied to the MOS transistors of the upper stages which turn off.

Due to the tolerances of the different components, all the transistors do not turn off at exactly the same time. If one of the transistors turns off more quickly than the others, it sees the whole of the supply voltage between its drain and source electrodes. If the supply voltage is greater than its breakdown voltage, a transil-type Zener power diode (Z1, Z2, Z3, FIG. 2) is connected in parallel between the drain and source of the associated power transistor in order to protect it. These diodes also serve the purpose of clipping the overvoltages produced by opening of the switch in the case of an inductive load. The Zener diode can be replaced by a switching aid circuit formed by an RCD system.

The control circuit with a capacitive control line according to FIG. 1 enables the switch to be opened and closed very quickly. However its immunity to large supply voltage variations is not perfect and this immunity can be improved in the manner described with reference to the following figures.

According to a first improvement of the circuit according to FIG. 1, represented in FIG. 2, turn-off of the power transistor of each higher stage (i≠1) is performed by a MOS transistor, T1, connected in parallel to the gate-source junction of the associated power transistor. When the transistor T1 is on, it short-circuits the gate and source of the associated power transistor which turns off. The gate of transistor T1 is connected to the output of a voltage detector 3. The latter receives on input a voltage representative of the drain-source voltage Vds of the lower stage (i−1).

Figure 3:
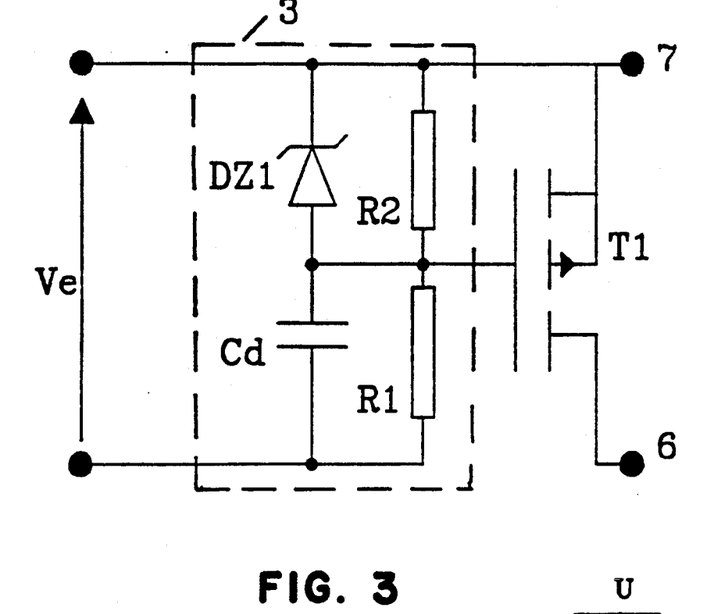
FIG. 3 represents a particular embodiment of a voltage detector of a switch according to FIG. 2.

In the particular embodiment of the detector 3 represented in FIG. 3, an input voltage Ve, representative of the voltage Vds of the lower stage, is applied to the input terminals of the detector. A voltage divider, comprising two resistances R1 and R2 in series, is connected between these input terminals. The voltage at the terminals of one of the resistances, R2 in the figure, forms the output voltage of the detector applied between the gate and source of transistor T1. Transistor T1 is turned on as soon as its gate-source voltage exceeds its threshold voltage, i.e. as soon as the voltage Ve applied to the detector input exceeds a preset threshold. A Zener diode DZ1, connected in parallel to the resistance R2, protects the gate-source junction of transistor T1. A capacitor Cd, connected in parallel to the resistance R1, improves the dynamic response of the detector.

In the embodiment according to FIG. 2, the transistor T1 is a P-type MOS transistor whose source and drain are respectively connected to the gate and source of the associated power transistor MOS2 or MOS3. The input terminals of the second stage detector 3, associated with the power transistor MOS2, are connected respectively to the gate of transistor MOS2 and to the source of transistor MOS1 of the lower stage. The detector input voltage Ve is given by:

$$Ve = Vds1 + Vgs2 \quad (5)$$

When the switch is closed, transistors MOS1 and MOS2 are on. The voltage Vds1 is in the order of one volt, and the voltage Vgs2 approximately 15 V. The detector voltage divider is such that the voltage at the terminals of the resistance R2 is then lower than the turn-on threshold of transistor T1 which is therefore off. When the control voltage Vco is reduced to zero, the first stage power transistor MOS1 turns off and its voltage Vds1 increases very quickly. The same is true of the voltage Ve and as soon as the latter exceeds a preset threshold corresponding to the turn-on voltage of transistor T1 being exceeded by the output voltage of the detector 3, transistor T1 turns on and short-circuits power transistor MOS2 which turns off. The voltage Vds2 then increases very quickly and this increase is detected by the third stage detector 3, associated with power transistor MOS3. The third stage detector turns the associated transistor T1 on, which short-circuits the gate and source of transistor MOS3, turning it off in turn. In the open position of the switch, the transistors T1 remain on and keep the higher stage power transistors turned off all the time.

The number of stages of the switch depends on the supply voltage U. To give an example, for a voltage U of 1200 V, a three-stage switch can be achieved with MOS power transistors whose maximum voltage Vds is in the order of 500 V. For a supply voltage of 2000 V to 2500 V five stages in series will be used. When a voltage step is applied to the control input Vco, it is transmitted by the capacitive line to the higher stages with an amplitude attenuation. If the capacities of the capacitive line capacitors are equal, for a three-stage switch, the attenuation is such that the voltage Vgs1 applied to the first stage is equal to Vco, the voltage Vgs2 is 2 Vco/3 and the voltage Vgs3 is Vco/3. To give an example, if Vco=15 V, when the control voltage is applied we obtain Vgs1=15 V, Vgs2=10 V and Vgs3=5 V. In practice, the attenuation is slightly greater than its theoretical value and the voltage Vgs3 can be even lower, in the order of 3 V. To propagate via the capacitive line a non-negligible voltage not only to the second stage, but also to the higher stages, a high control voltage Vco is therefore required.

Furthermore, after the transient closing period, when all the power conductors are on, the voltage Vgsi of the ith stage power transistor is given by:

$$Vgsi = Vco - (Vd + Rdson \cdot Ich)(i-1) \quad (6)$$

where Rdson is the drain-source resistance of a power transistor in the on state, Ich the load current flowing through the switch and Vd=0.7 V, the voltage at the terminals of the diode Di (D2, D3 . . .) associated with the stage.

To keep the power transistors of all the stages turned on, it is indispensable that the voltage Vgsi of the last stage be greater than the minimum gate-source voltage turning on the power transistor involved. For a power transistor of a given type, as the load current and supply voltage U, fixing the minimum number of stages, are preset, this implies using a minimum control voltage Vco, in accordance with equation (6).

To give an example, if Rdson=0.4 Ohms, Vgs=8 V for Ich=13 A, the minimum control voltage Vco to be applied to a five-stage switch is 32 V. Yet this voltage which is applied to the first stage gate is greater than the voltage Vgs1 permissible by the transistor MOS1.

If the control voltage Vco is limited to a voltage permissible by the first stage power transistor MOS1, for example 15 V, the maximum load current that can be obtained while maintaining the fifth stage voltage Vgs5 at a sufficient value, for example 6 V, is, according to equation (6), 3.8 A.

The control voltage Vco must therefore be sufficiently high to enable a preset load current to be obtained with a minimum number of stages fixed by the supply voltage.

When the necessary control voltage Vco is greater than the voltage Vgs1 permissible by the first stage, the gate-source junction of the first stage power transistor has to be protected. This protection could be achieved by means of a suitable Zener diode connected between the gate of transistor MOS1 and the control terminal 2 of the switch, a resistance being connected between the gate and source of transistor MOS1.

However, in the upper stages the voltage Vgs depends on the load current, in compliance with equation (6). If we go back to the example of a five-stage switch for which the control voltage Vco is 32 V, we have, for a load current of 13 A, Vgs5=8.4 V. On the other hand, with no load (Ich=0), Vgs5=29.2 V, Vgs4=29.9 V, Vgs3=31.4 V and Vgs2=31.3 V. In this case, the gate-source junctions of the power transistors of all the higher stages have to be protected for low drain currents, without limiting the voltage Vgs for high drain currents. A single Zener diode can then be used.

Figure 4:
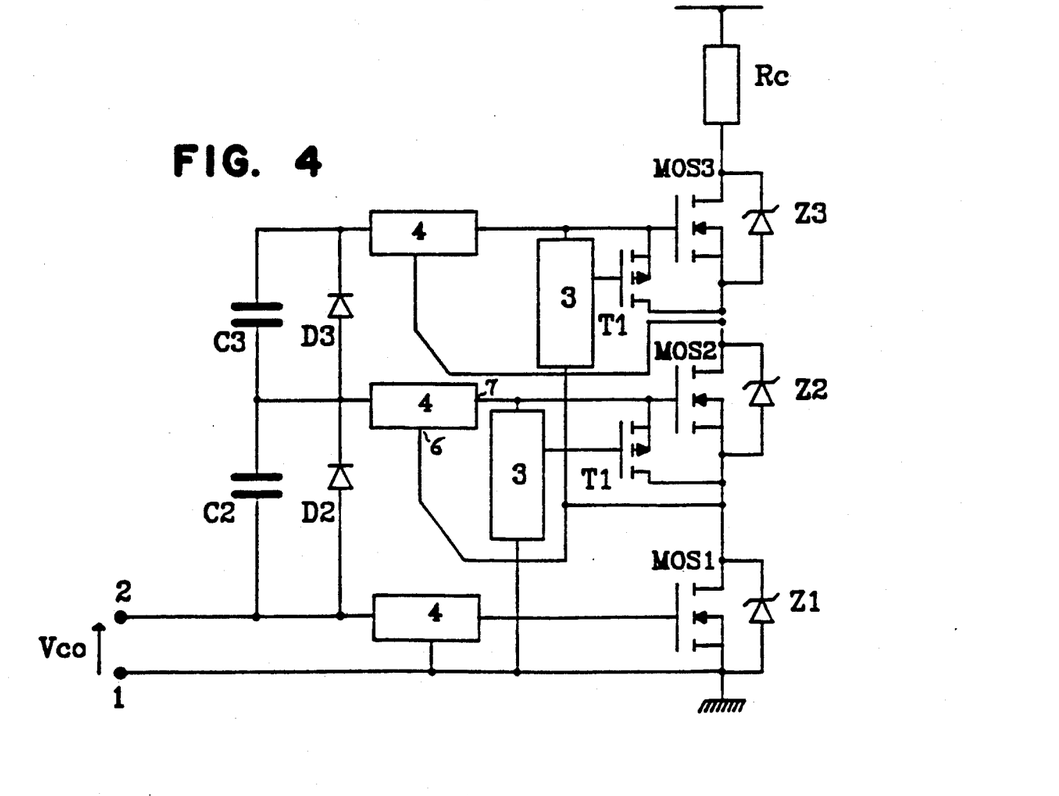
FIG. 4 represents an improvement to the switch according to FIG. 3.

According to an improvement of the invention, each stage, including the first one, comprises a voltage regulator 4 designed to regulate the gate-source control voltage applied to the power transistor of the stage (FIG. 4).

Figure 5:
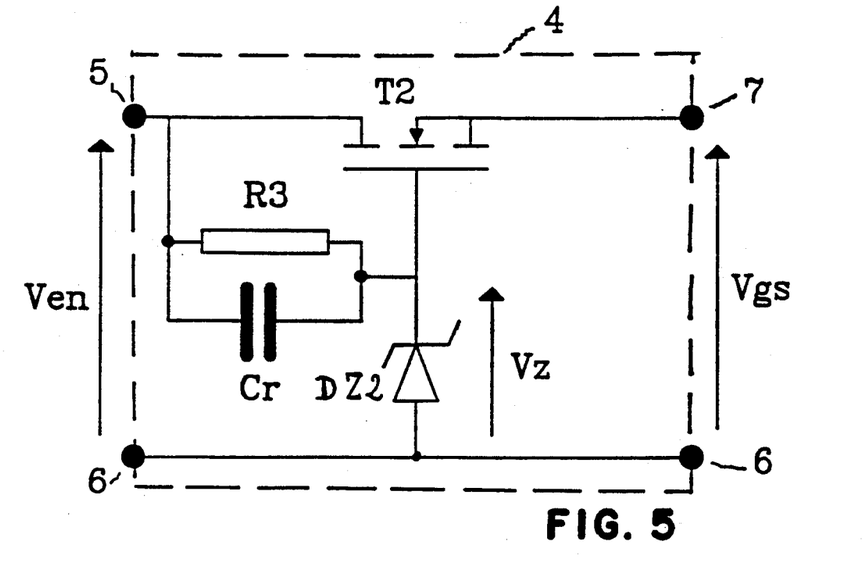
FIG. 5 illustrates a particular embodiment of a voltage regulator of a switch according to FIG. 4.

A particular embodiment of the regulator 4 is illustrated in FIG. 5. The regulator input voltage Ven is applied between a first, input, terminal 5 and a second, input-output, terminal 6, to the serial assembly of a resistance R3 and a Zener diode DZ2. The first terminal 5 is connected to a third, output, terminal 7 via a transistor T2, whose control electrode is connected to the common point of the resistance R3 and the Zener diode DZ2. Transistor T2 is preferably a MOSFET-type transistor. So long as the input voltage Ven is lower than the voltage Vz of the Zener diode DZ2, the output voltage Vgs follows the input voltage appreciably linearly, the difference between the two voltages corresponding appreciably to the gate-source voltage, for example 5 V, of transistor T2. When the input voltage reaches or exceeds the voltage Vz, the output voltage remains constant and equals the difference between the voltage Vz and the gate-source voltage of transistor T2. To improve the regulator dynamics, a capacitor Cr can be connected in parallel to resistance R3.

As represented in FIG. 4, the input terminal 5 of the first stage regulator 4 is connected to the control terminal 2 and for the stages of rank higher than one, to the cathode of the diode associated with this stage : cathode of D2 for the second stage comprising transistor MOS2, cathode of D3 for the third stage comprising transistor MOS3. The regulator input-output 6 and output terminals 7 are respectively connected to the source and gate of the power transistor of the stage.

Figure 6:
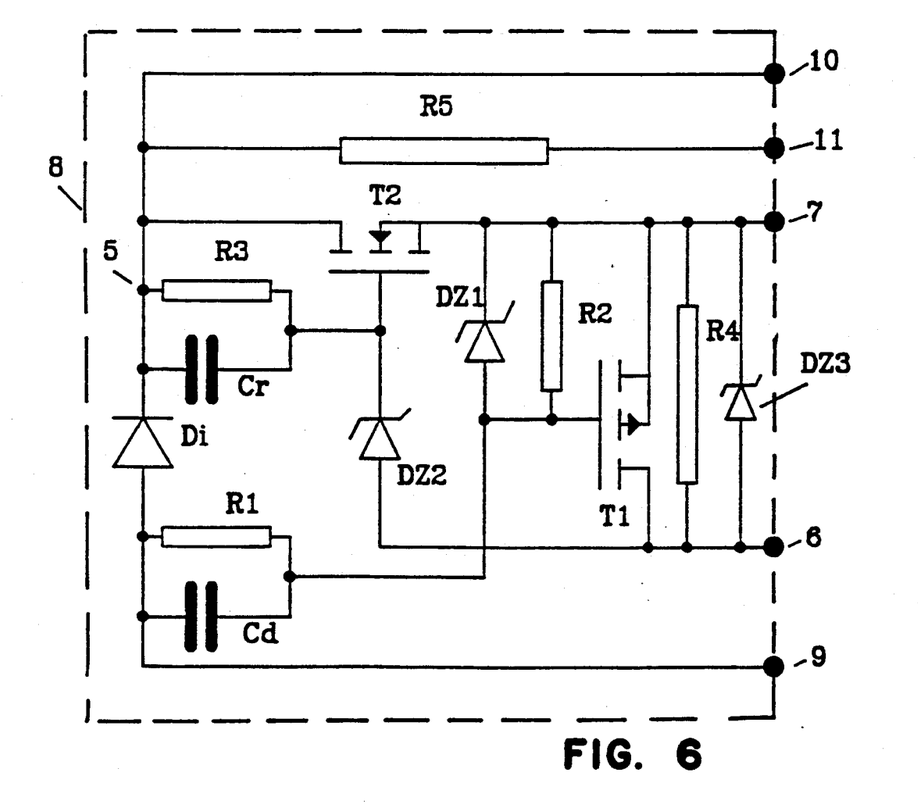
FIG. 6 represents a standard control module of a switch stage.
Figure 9:
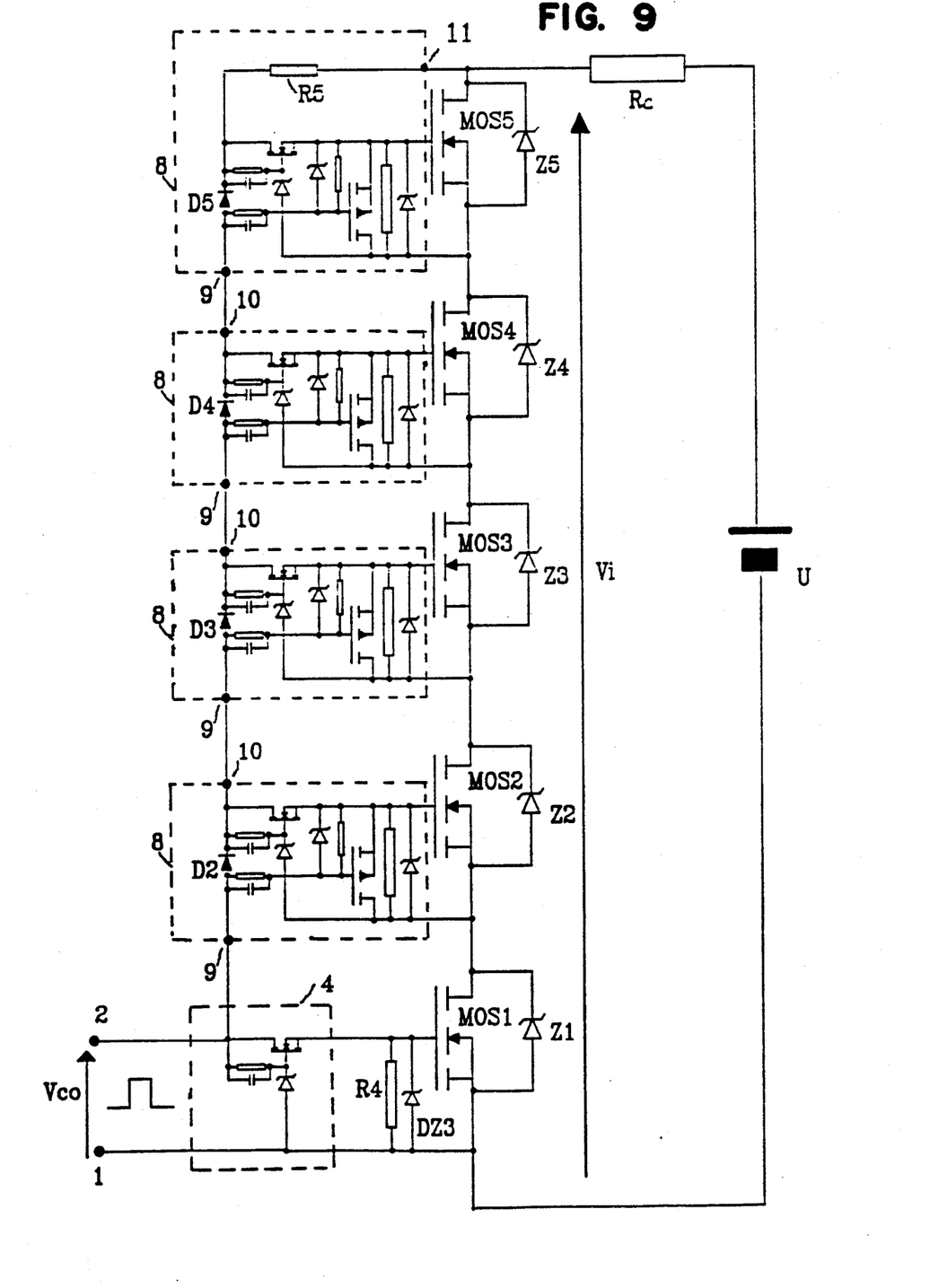
FIG. 9 represents a particular embodiment of a five-stage switch using standard modules according to FIG. 6.
Figure 10A:
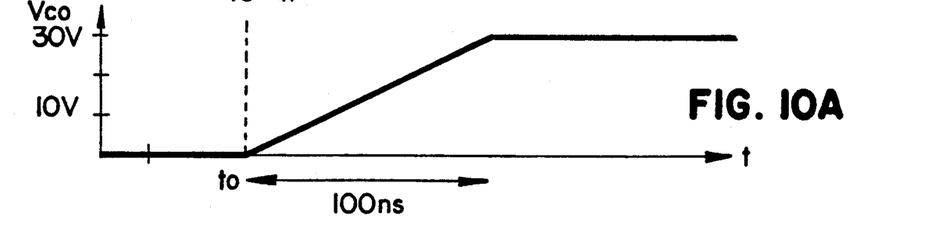
Figure 10B:
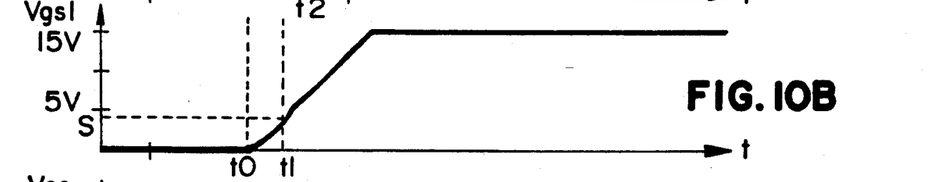
Figure 10C:
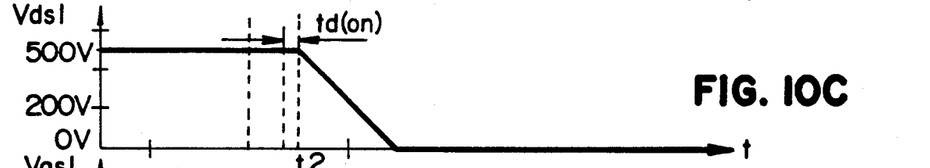
Figure 10D:
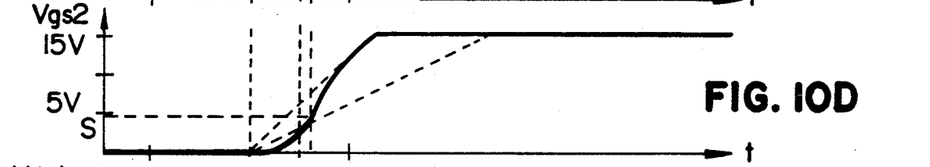
Figure 10E:
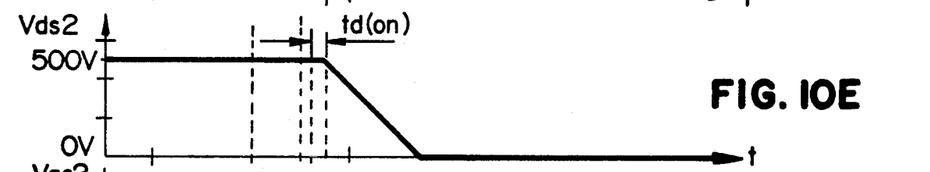
Figure 10F:
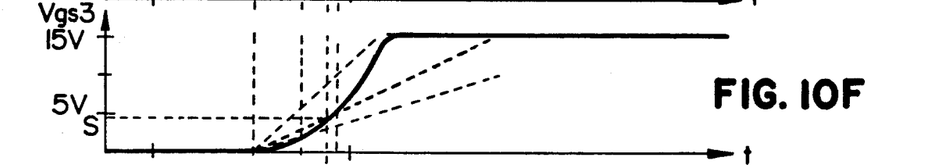
Figure 10G:
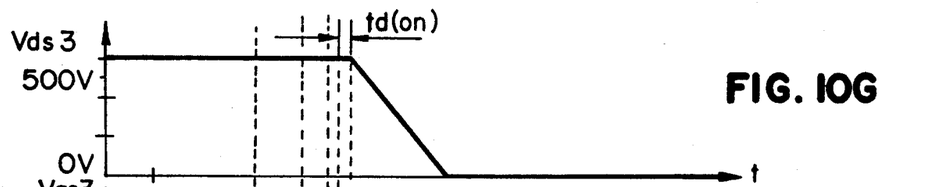
Figure 10H:
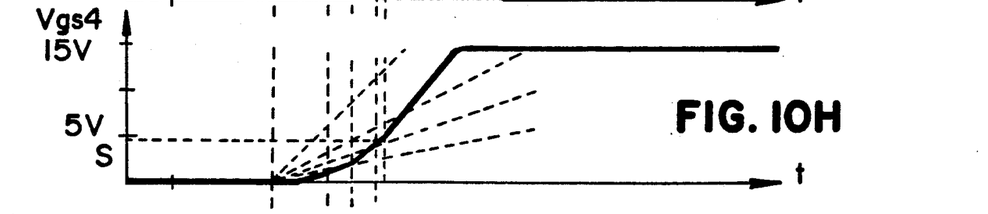
Figure 10I:
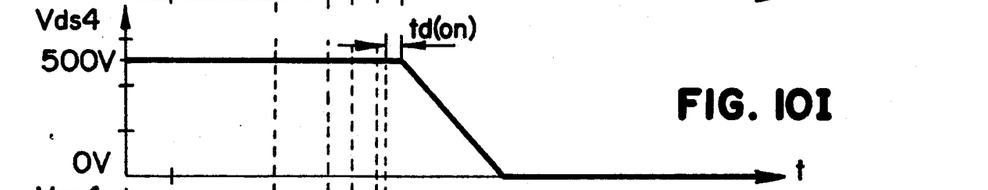
Figure 10J:
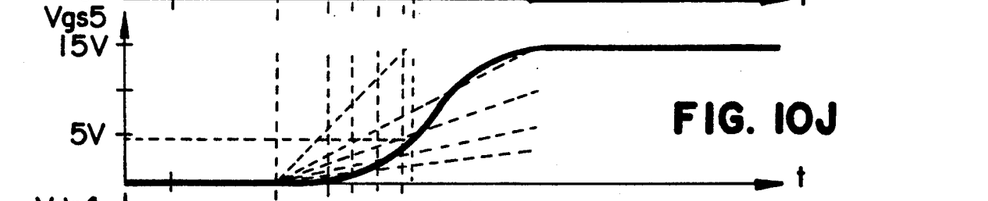
Figure 10K:
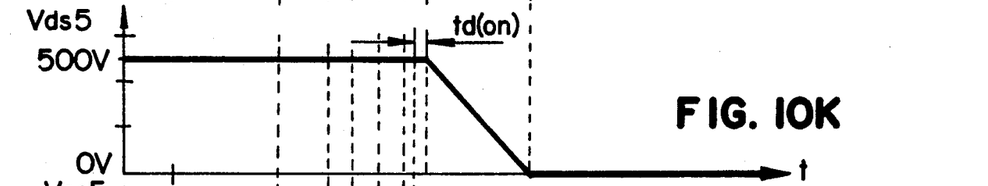
Figure 10L:
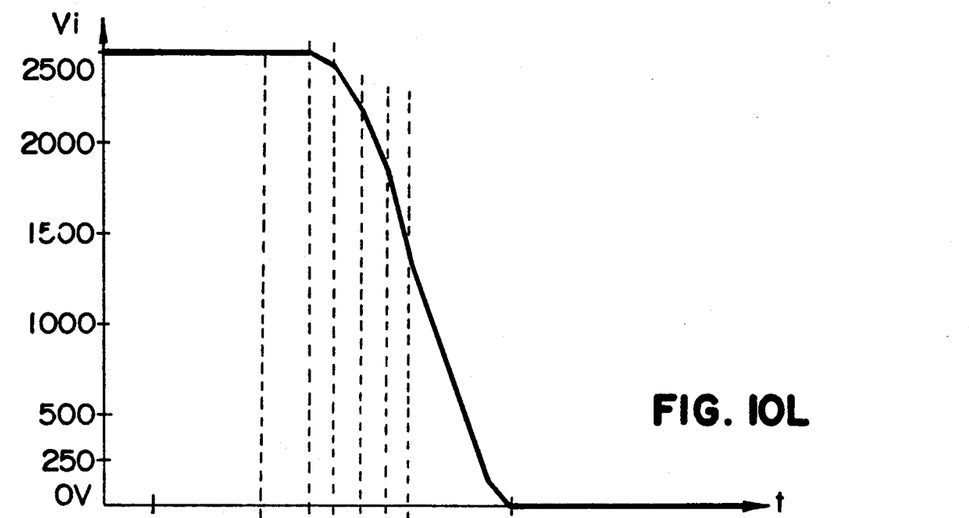
Figure 11A:
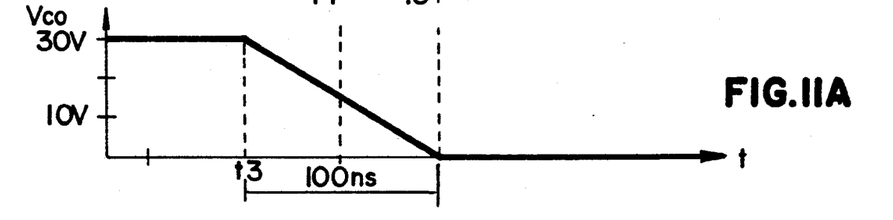
Figures 11B, 11C:
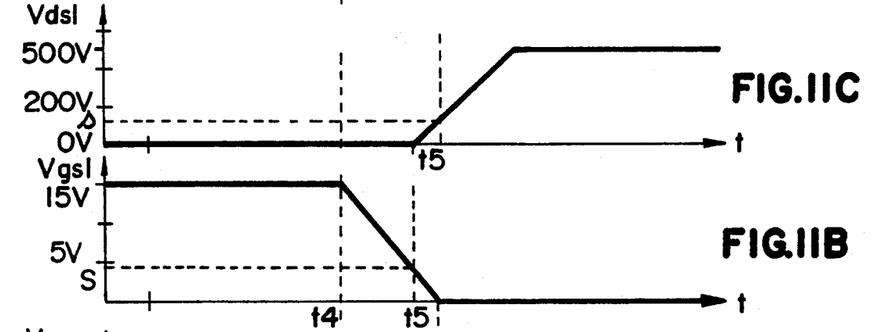
Figures 11D, 11E:
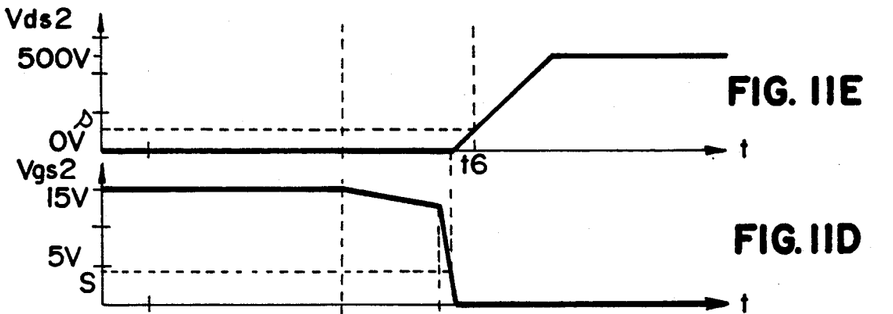
Figure 11F:
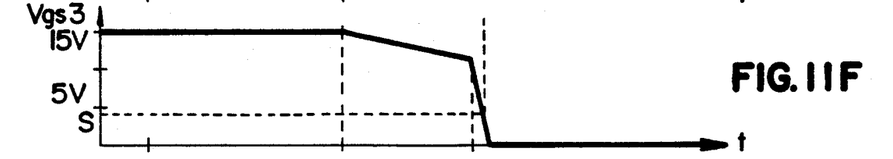
Figure 11G:
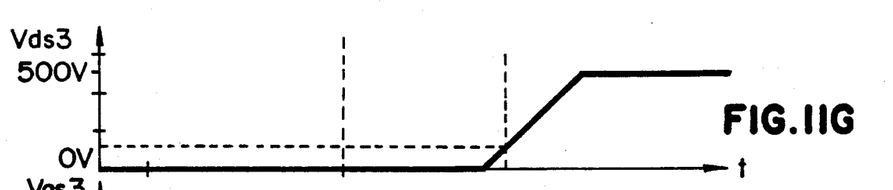
Figure 11H:
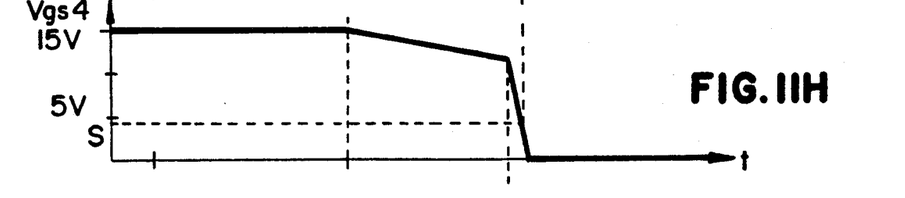
Figure 11I:
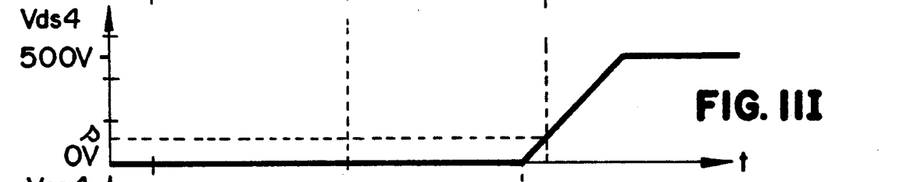
Figure 11J:
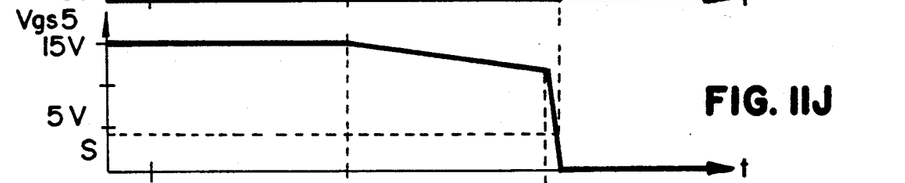
Figure 11K:
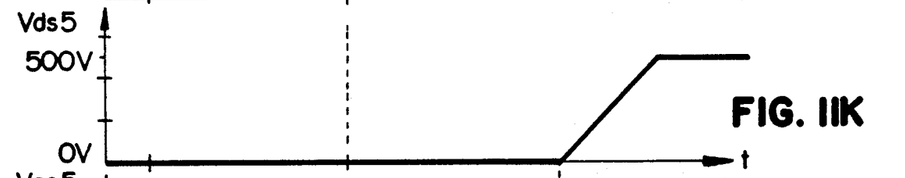
Figure 11L:
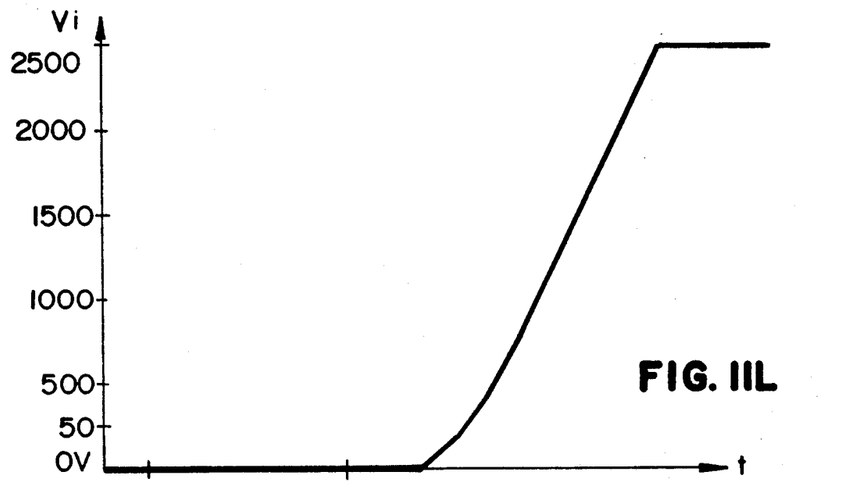

FIG. 6 illustrates a standard control module 8 of an upper stage of a switch, combining a voltage detector according to FIG. 3 and a regulator according to FIG. 5, and FIG. 9 represents a five-stage switch comprising a standard module of this kind for control of its second, third, fourth and fifth stages, the first stage not comprising a detector but only a regulator 4.

Figure 8:
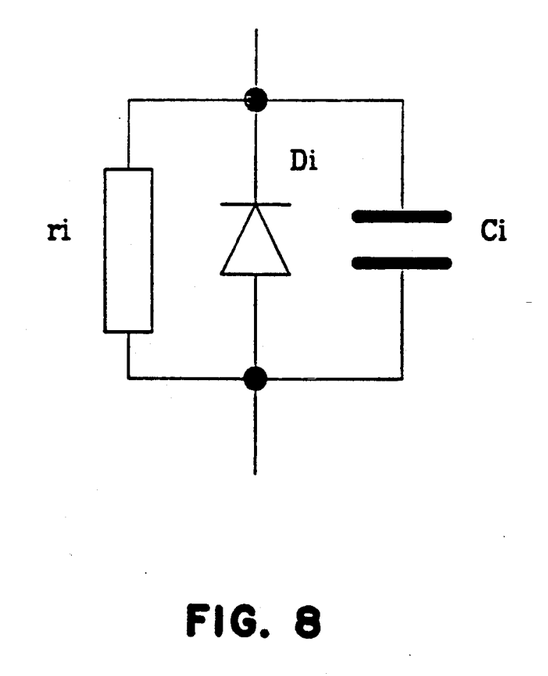

The standard module 8 comprises two monitoring terminals designed to be connected respectively to the source and gate of the power transistor MOSi of the corresponding stage, of order i, i being greater than 1. These monitoring terminals are respectively connected to the output terminals 6 and 7 of the regulator 4 and to the drain and source of transistor T1. A resistance R4 and a Zener diode DZ3 are connected, in a conventional manner, in parallel between these monitoring terminals to protect the associated power transistor against overvoltages and against external disturbances. Each module comprises an input terminal 9 connected to an output terminal 10 by the diode Di of the corresponding stage. The input terminal 9 of the module 8 of a stage is connected to the output terminal 10 of the module 8 of the stage below, the input terminal of the second stage module being connected to the control input 2. A standard module comprises a second output terminal 11, connected to the first output terminal 10 by means of a resistance R5. This output terminal 11 is used, instead of the output terminal 10, for the module of the highest stage. Thus in FIG. 9, the output 11 of the fifth stage module 8 is connected to the drain of power transistor MOS5. Different modules could naturally be designed for the intermediate stages (second, third and fourth stages in FIG. 9) and for the highest stage (fifth stage in FIG. 9), but providing two output terminals 10 and 11 makes it possible to have a single, standard module for all the stages, except for the first one.

In the module 8, the input voltage Ve of the voltage detector 3 is not, as in FIGS. 2 and 4, measured directly between the gate of the stage power transistor and the source of the power transistor of the adjacent lower stage.

Indeed, as the detector 3 of stage i operates to detect an increase of the voltage Vds $(i-1)$ of the power transistor of the adjacent lower stage when the latter turns off, that is to say when the voltage Vgs $(i-1)$ is zero, the voltage between power transistor gates of two adjacent stages is also representative of the voltage Vds $(i-1)$ and can be used as input voltage Ve of the detector. In the particular embodiment in FIGS. 6 and 9, comprising in addition a regulator 4 per stage, the voltage between the power transistor gates of stages i and $i-1$ decreased by the drain-source voltage, which is appreciably constant, of transistor T2 of the regulator 4 of stage $i-1$, is used as the input voltage of the detector 3 of a stage i ($i\neq 1$). This arrangement enables each module to have a single input terminal 9 designed to be connected to the module of the stage below, while integrating the diode Di of the stage in the module. In addition, when the switch closes, the transistors T1 must turn off as quickly as possible. With the embodiment represented in FIGS. 6 and 9, the capacitor Cd of detector 3, which in the open position of the switch is charged at a high voltage, discharges through the resistance R2 when a positive control voltage Vco is applied to the switch, thus applying a negative voltage pulse to the terminals of resistance R2, which instantaneously turns transistor T1 off.

The standard module 8 comprises for each stage i ($i\neq 1$) not only the detector 3, regulator 4 and diode Di, but also the capacitor Ci and a resistance ri connected in parallel to capacitor Ci and diode Di (FIG. 8).

Figure 7:
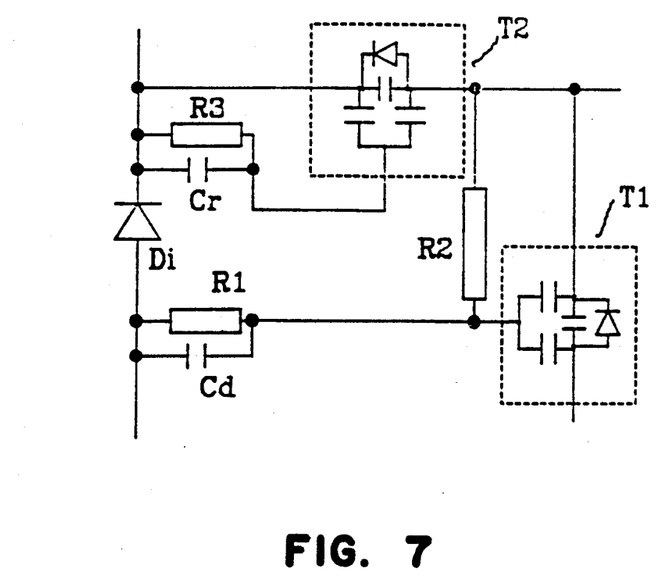
FIGS. 7 and 8 illustrate a particular embodiment of the capacitors Ci and resistances ri of each stage.

Indeed, as illustrated in FIG. 7, in each module capacitor Ci is achieved by the combination of capacitors Cd and Cr and the internal capacitors of transistors T1 and T2. In the same way resistances ri are achieved by serial connection of resistances R1, R2 and the internal diode of transistor T2 (MOSFET-type transistor).

The resistances ri form with resistance R5 of the last stage a divider bridge designed to equalize the voltages applied to the different stages. Their values, in the order of a megaohm, are sufficiently great for the leakage current to be negligible.

FIGS. 10A to 10L represent the wave forms on closing of the switch of the voltages Vgs1 to Vgs5, Vds1 to Vds5 and of the voltage Vi at the terminals of the five-stage switch according to FIG. 9, supplied by a supply voltage U of 2500 V and controled by a voltage Vco going from 0 V at time $T_o$ to 30 V in 100 ns.

FIGS. 11A to 11L represent the wave forms of the same voltages on opening of the switch, when the control voltage Vco is reduced to zero in 100 ns.

When the switch closed (FIGS. 10A to 10L), the control voltage Vco is transmitted by the capacitive line with an amplitude attenuation which is greater the higher the stage. The voltage Vgs1 therefore increases more quickly than the voltages Vgs2 to Vgs5 and reaches first, at time t1, the threshold voltage S of the corresponding power transistor, thus causing transistor MOS1 to turn on at time t2, with $t2-t1=td(on)$. The power transistors of the upper stages turn on successively when their voltage Vgs reaches the threshold voltage S. The voltages Vgs1 to Vgs5 are limited to 15 V by the regulators 4.

When the switch opens (FIGS. 11A to 11L), the decrease of the control voltage Vco from time t3 results in a corresponding decrease of the voltage Vgs1 from time t4 (delay due to the regulator 4). When the latter drops below the threshold S at time t5, transistor MOS1 turns off. The increase of the voltage Vds1 is detected by the second stage detector, and when the voltage Vds1 reaches a threshold s, the detector orders turning-on of the associated transistor T1 which short-circuits the gate-source junction of MOS2. At time t6, Vgs2 drops below the threshold S and turns transistor MOS2 off. This process continues until all the power transistors have been turned off. Between time t4 and turning-on of the stage transistor T1, the gate-source capacitors of the power transistors of the upper stages discharge slowly into the associated resistance R4.

The invention enables high voltages to be switched very quickly for a high current. To give an example, a five-stage switch according to FIG. 9, made of discrete components, comprising IRF450-type MOSFET power transistors supplied by a voltage of 2000 V, enabled a 13 A current to be switched with a switch closing time of 200 ns and an opening time of 320 ns.

To reduce the influence of stray inductions due to the lengths of the component lugs and the length of the printed circuit tracks, and consequently to obtain better performances as far as the switching times are concerned, the switch control device will preferably be formed by a hybrid circuit. The standard module according to FIG. 6 was particularly designed with a view to being achieved in the form of a hybrid circuit.

The invention is not limited to the embodiments described above. In particular the power transistors can be formed by any type of voltage-controlled semi-conductor, for example by IGBT-type transistors.

In the same way, the power transistors can be formed by P-type MOS and not N-type MOS as in the particular embodiments represented, the first stage then being connected to the positive terminal of the supply voltage. The load resistance Rc can, for its part, be connected between the negative terminal of the supply voltage and the source of transistor MOS1, the control voltage Vco remaining applied between the gate and source of MOS1.

A capacitor, of the same value as the capacitors C2 to C5 of the different stages can be connected between the gate and source of the power semi-conductor of the last stage to complete the capacitive line and balance the voltages. In practice, a capacitor of this kind is not necessary, the internal gate-drain capacitor of the power semi-conductor of the last stage proving sufficient.

We claim:

1. A medium voltage static switch comprising: a plurality of voltage-controlable semi-conductor devices, each semi-conductor device comprising a gate, a source and a drain, connected in series with a load impedance to the terminals of a voltage supply, and a control device comprising a plurality of successive stages, each stage comprising one of the semi-conductor devices, wherein the control device comprises a single control input formed by first and second control terminals respectively connected to the source and gate of the semi-conductor device of a first stage of the successive stages, and a capacitance is connected in parallel with a diode between the gates of the semi-conductor devices of adjacent stages, said diodes being reverse polarized when the switch is open, and wherein each successive stage above the first stage includes a detection circuit, to whose input a voltage is applied that is representative of the drain-to-source voltage of the semi-conductor device of a preceding stage, and a detection circuit semi-conductor device, connected between the source and gate of the semi-conductor device of the respective stage and having a gate connected to the output of the detection circuit of the respective stage, wherein the detection circuit semi-conductor device is turned off when the drain-to-source voltage applied to the input of the detect circuit exceeds a preset threshold.

2. The switch according to claim 1, wherein a Zener diode is connected in parallel between the source and drain of each semi-conductor device.

3. The switch according to claim 1, wherein the detection circuit comprises first and second resistances connected in series between the gates of the semi-conductor devices of adjacent stages, a capacitor connected in parallel to the first resistance, and a Zener diode connected in parallel to the second resistance, wherein the voltage at the terminals of the second resistance constitute the output voltage of the detector.

4. The switch according to claim 1, wherein each stage comprises a voltage regulator designed to limit the gate-source voltage applied to the semi-conductor device of said stage.

5. The switch according to claim 4, wherein the voltage regulator comprises a first terminal, connected to the cathode of the diode associated with the respective stage in stages above the first stage and to the second control terminal in the first stage; a second terminal connected to the drain of the semi-conductor of the respective stage; and a third terminal connected to the gate of the semi-conductor device of the respective stage.

6. The switch according to claim 5, wherein the voltage regulator comprises a voltage regulator semi-conductor device connected between its first and third terminals, a third resistance connected in series with a Zener diode between its first and second terminals, the control electrode of the voltage regulator semi-conductor device being connected to a point common to said Zener diode and to the third resistance, so as to limit the voltage between the second and third terminals of the regulator.

7. The switch according to claim 1, further comprising a resistance in parallel with the capacitor and diode connecting the gates of two adjacent power semi-conductors, and an additional resistance connected between the gate and drain of the power semiconductor of the highest ranking stage.

8. The switch according to claim 6, wherein the capacitance connected between the gates of the semi-conductor devices of adjacent stages is formed by serial connection of the capacitor of the detection circuit of a respective stage, internal capacitances of the detection and voltage regulation semi-conductor devices, and a second capacitor connected in parallel to the third resistance of said regulator, a resistance connected in parallel to said capacitor being formed by serial connection of the first and second resistances of the detection circuit and a diode internal to the voltage regulator semiconductor device, an additional resistance being connected between the drain of the semi-conductor device of the highest stage and the first terminal of the regulator of the highest stage.

9. The switch according to claim 1, wherein the semiconductor devices are MOSFET-type transistors.

* * * * *